(12) United States Patent
Dusad et al.

(10) Patent No.: US 12,244,288 B2
(45) Date of Patent: Mar. 4, 2025

(54) BALUN WITH IMPROVED COMMON MODE REJECTION RATIO

(71) Applicant: Texas Instruments Incorporated, Dallas, TX (US)

(72) Inventors: Shagun Dusad, Bangalore (IN); Vysakh Karthikeyan, Kerala (IN); Naveen Mahadev, Bangalore (IN); Rafi Mahammad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/531,264

(22) Filed: Dec. 6, 2023

(65) Prior Publication Data

US 2024/0113678 A1    Apr. 4, 2024

Related U.S. Application Data

(62) Division of application No. 17/463,886, filed on Sep. 1, 2021, now Pat. No. 11,888,459.

(30) Foreign Application Priority Data

Dec. 1, 2020   (IN) .............................. 202041052242

(51) Int. Cl.
  *H03H 7/42*   (2006.01)
  *H01F 27/28*  (2006.01)
  *H03H 7/00*   (2006.01)
  *H03H 7/38*   (2006.01)

(52) U.S. Cl.
  CPC ............... *H03H 7/42* (2013.01); *H01F 27/28* (2013.01); *H03H 7/004* (2013.01); *H03H 7/38* (2013.01)

(58) Field of Classification Search
  CPC .......... H03H 7/004; H03H 7/42; H01F 27/28
  See application file for complete search history.

(56) References Cited

U.S. PATENT DOCUMENTS

| | | | | |
|---|---|---|---|---|
| 3,988,690 A | * | 10/1976 | Vance | H04B 1/1623 330/10 |
| 2007/0120637 A1 | * | 5/2007 | Ezzeddine | H01F 17/0013 336/200 |
| 2014/0320374 A1 | | 10/2014 | Lai | |
| 2022/0038069 A1 | | 2/2022 | Dasgupta | |

* cited by examiner

*Primary Examiner* — Patrick C Chen
(74) *Attorney, Agent, or Firm* — John R. Pessetto; Frank D. Cimino

(57) ABSTRACT

A balun includes a first winding which has a first terminal coupled to an input, and a second terminal coupled to a reference potential terminal. The balun includes a second winding magnetically coupled to the first winding. The second winding has a first terminal coupled to a first differential output, a second terminal coupled to a second differential output, and a tap coupled to the reference potential terminal. The balun includes a first capacitor which has a first terminal coupled to the first winding and a second terminal coupled to the second winding. The balun includes a third winding which has a first terminal coupled to the reference potential terminal and a floating second terminal. The balun includes a second capacitor which has a first terminal coupled to the third winding and a second terminal coupled to the second winding.

13 Claims, 4 Drawing Sheets

BALUN WITH IMPROVED COMMON MODE REJECTION RATIO

CROSS REFERENCE TO RELATED APPLICATION

This application is a division of U.S. patent application Ser. No. 17/463,886, filed Sep. 1, 2023, which claims priority to India Provisional Application No. 202041052242, filed Dec. 1, 2020, both of which are hereby incorporated herein by reference in their entireties.

TECHNICAL FIELD

This description relates generally to balun transformers.

BACKGROUND

Balanced-to-unbalanced (balun) devices are transformers which are commonly used in wireless communications to couple differential radio-frequency, microwave, or millimeter-wave frequency signals between functional circuit blocks. Baluns are used for single-ended to differential conversion or differential to single-ended conversion of signals.

In a single-ended to differential conversion, one of the two terminals of a primary winding is grounded and the other terminal is excited with a single-ended input. The ideal resulting output on a secondary winding is purely differential (e.g., the potential is determined by the difference between the two terminals of the secondary winding as opposed to the difference between one terminal and ground).

At high frequencies, the parasitic capacitance between the primary and secondary windings leads to undesirable common-mode signals at the secondary winding when the balun is excited with a single-ended input. The impedance of the parasitic capacitance becomes less at high frequencies, which leads to capacitive coupling between the primary and the secondary windings. The primary winding is asymmetrically grounded (e.g., one terminal is connected to ground while the other terminal is connected to a power supply), but the secondary winding is magnetically coupled to the primary winding, causing a degraded common-mode rejection due to this asymmetry.

Common-mode signals at the secondary winding terminals should be suppressed to maximize the signal power in the differential mode and to avoid common-mode variation in the operating point of subsequent circuitry.

In a single-ended to differential conversion, the differential mode conversion gain is defined as the ratio of the differential signal power at the secondary winding to the single-ended signal power at the first terminal of the primary winding, where the second terminal of the primary winding is grounded. The common mode conversion gain is defined as the ratio of the common mode signal power at the secondary winding to the single-ended signal power at the first terminal of the primary winding, where the second terminal of the primary winding is grounded. The common mode rejection ratio (CMRR) of the balun is defined as the ratio of the differential mode conversion gain to the common mode conversion gain.

In a differential to single-ended conversion, the input at the primary winding is not perfectly differential, which leads to a common mode component at the primary winding. The common mode component at the primary winding is coupled to the secondary winding. The CMRR of the balun is defined as the ratio of the differential mode conversion gain to the common mode conversion gain.

Maximizing the CMRR is desirable for conversion of the input signal power to the desirable output signal power and also to reduce the undesirable common-mode output signal at the secondary winding.

SUMMARY

In one aspect, a balun includes a first winding which has a first terminal coupled to an input, and a second terminal coupled to a reference potential terminal. The balun includes a second winding magnetically coupled to the first winding. The second winding has a first terminal coupled to a first differential output, a second terminal coupled to a second differential output, and a tap coupled to the reference potential terminal. The balun includes a first capacitor which has a first terminal coupled to the first winding and a second terminal coupled to the second winding. The balun includes a third winding magnetically coupled to the first winding. The third winding includes a first terminal coupled to the reference potential terminal and a floating second terminal. The balun includes a second capacitor which has a first terminal coupled to the third winding and a second terminal coupled to the second winding.

In an additional aspect, the tap is coupled to the center of the second winding.

In an additional aspect, the first and second capacitors have equal capacitances.

In an additional aspect, the first terminal of the first winding is coupled to an input voltage.

In an additional aspect, the first differential output provides a first differential voltage and the second differential output provides a second differential voltage.

In an additional aspect, a balun includes a first winding which has a first terminal coupled to a first differential input, a second terminal coupled to a second differential input, and tap coupled to a reference potential terminal. The balun includes a second winding magnetically coupled to the first winding. The second winding has a first terminal coupled to a single-ended output and a second terminal coupled to the reference potential terminal. The balun includes a first capacitor which has a first terminal coupled to the first winding and a second terminal coupled to the second winding. The balun includes a third winding magnetically coupled to the first winding. The third winding has a first terminal coupled to the reference potential terminal and a floating second terminal. The balun includes a second capacitor which has a first terminal coupled to the third winding and a second terminal coupled to the first winding.

DETAILED DESCRIPTION

Figure 1:
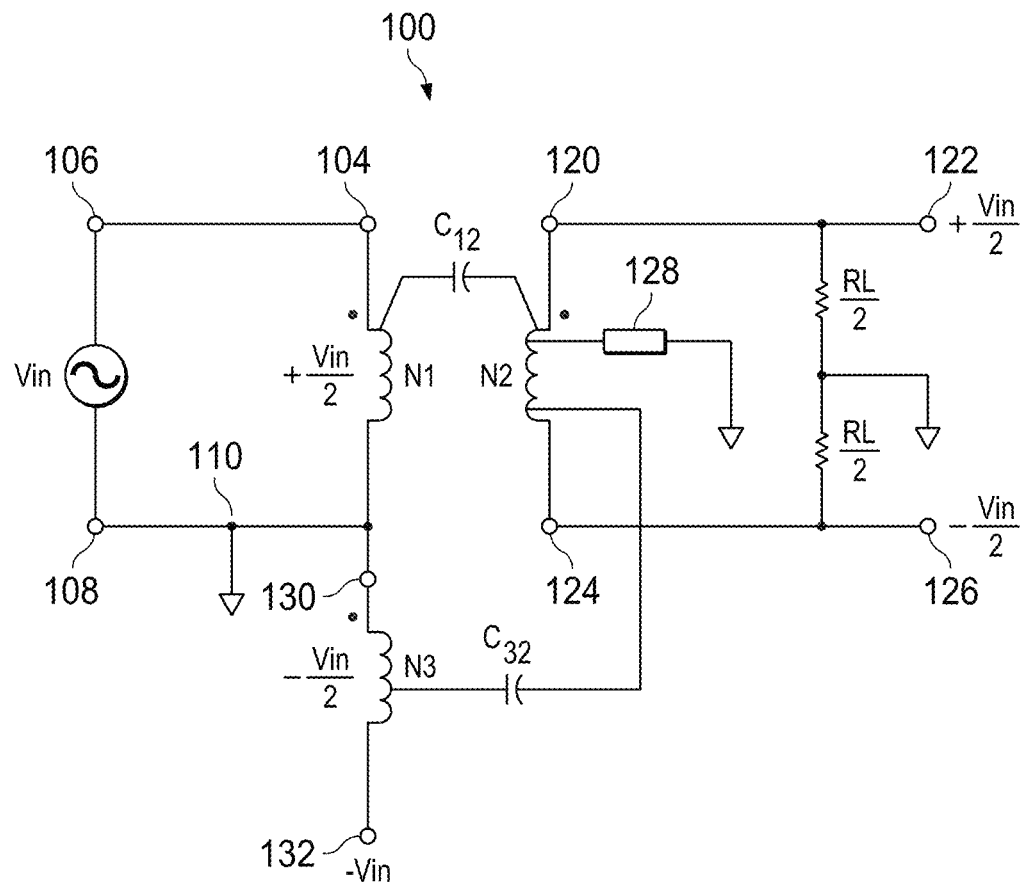
FIG. 1 is a circuit diagram of a single-ended to differential balun of an example embodiment.

FIG. 1 is a single-ended to differential balun 100 (also referred to as a S2D balun transformer) of an example embodiment. The balun 100 includes a first winding N1 (e.g., primary) which has a first terminal 104 coupled to a single-ended input 106. The first winding N1 has a second terminal 108 coupled to a reference potential terminal 110 (e.g., electrical ground). An AC voltage source Vin can be coupled between the single-ended input 106 and the reference potential terminal 110.

The balun 100 includes a second winding N2 (e.g., secondary) which is magnetically coupled to the first winding N1 (e.g., N1 and N2 may form the primary winding and the secondary winding, respectively, of a transformer or N1 and N2 may be configured so as to facilitate magnetic coupling without forming a transformer). The second winding N2 has a first terminal 120 which is coupled to a first differential output 122 and has a second terminal 124 which is coupled to a second differential output 126. The second winding N2 has a tap 128 (e.g., center tap) which is coupled to the reference potential terminal 110. In some embodiments, the center tap 128 may be shorted to ground. In other embodiments, the center tap 128 can be an AC coupling capacitive element (not shown in FIG. 1) coupled to common potential (e.g. ground or electrical ground). A first resistive load RL/2 is coupled between the first differential output 122 and ground, and a second resistive load RL/2 is coupled between the second differential output 126 and ground. Because, the balun 100 provides a differential output, two equal loads (RL/2, RL/2) are shown coupled between the differential outputs 122 and 126. In some example embodiments, a load (which may include a battery, circuitry, electronics or an electromechanical device) may be connected between terminals 122 and 126.

The first and second windings N1 and N2 may be in close proximity to one another such that the first and second windings N1 and N2 are magnetically coupled. A capacitance represented by $C_{12}$ may be present between the first and second windings N1 and N2. $C_{12}$ may include parasitic capacitors as well as intentionally-added capacitors. The capacitance $C_{12}$ degrades the CMRR of the balun 100 by allowing common mode current to flow from the first winding N1 to the second winding N2.

In an example embodiment, a third winding N3 (tertiary winding) is added to the balun to reduce the effect of the common mode current flowing through the capacitance $C_{12}$ to the second winding N2. The third winding N3 has a first terminal 130 which is coupled to the reference potential terminal 110 (coupled, for example, to ground). The third winding N3 has a second terminal 132 which is floating (e.g. not connected to another component or supply), as is discussed in further detail below. The first and third windings N1 and N3 are magnetically coupled.

The third winding N3 may be in close proximity to the second winding N2 such that a capacitance represented by $C_{32}$ may be present between the third and second windings N3 and N2. In an example embodiment, the capacitance $C_{32}$ may include a capacitor which is added intentionally as well as a parasitic capacitance.

If the voltage Vin is applied to the single-ended input 106, a common mode component Vin/2 is present across N1. The common mode component Vin/2 is equal to the average of the potential at the first terminal 104 of N1 and the potential at the second terminal 108 of N1. Also, differential mode components which have equal amplitude, yet opposite polarity, are present at the differential outputs 122 and 126. Assuming N1=N2, a differential mode component Vin/2 is present at the first differential output 122 and a differential mode component −Vin/2 is present at the second differential output 122. Because the differential mode components have the same amplitude, yet opposite polarity, the center tap 128 acts as a virtual ground, because it is a potential that is half-way between the potential at node 120 and node 124.

Because the first terminal 130 of the third winding N3 is coupled to the reference potential terminal 110 (e.g., electrical ground) and the second terminal 132 of the third winding N3 is floating, a voltage which has equal magnitude of Vin but opposite polarity (i.e., −Vin) is present at the second terminal 132. Thus, a common mode voltage −Vin/2 is present across the third winding N3.

Figure 2:
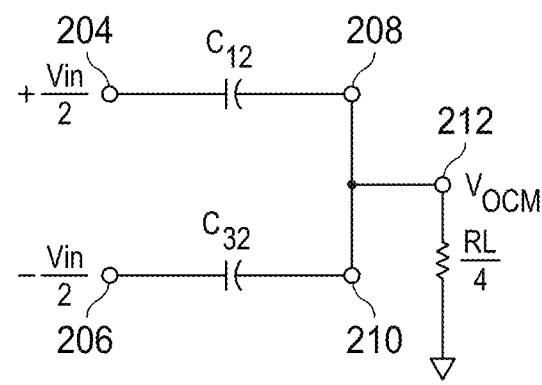
FIG. 2 is a common mode equivalent circuit of the balun of FIG. 1.

FIG. 2 illustrates a common mode equivalent circuit 200 of the balun 100. The equivalent circuit 200 includes the capacitor $C_{12}$ which has a first terminal 204 coupled to a voltage source Vin/2 (common mode component of Vin across N1). The equivalent circuit 200 includes the capacitor $C_{32}$ which has a first terminal 206 coupled to a voltage source −Vin/2 (common mode component of Vin across N3). The capacitors $C_{12}$ and $C_{32}$ have respective second terminals 208 and 210 which are coupled to an output terminal 212. A resistive load represented by RL/4 (parallel equivalent of RL/2 and RL/2) is coupled between the output terminal 212 and ground. The common mode voltages Vin/2 and −Vin/2 are coupled to the secondary winding which leads to a common mode voltage Vocm at the output terminal 212. If $C_{32}=C_{12}$, the common mode component of Vin/2 at the output terminal 212 is approximately nullified by the common mode component of −Vin/2 at the output terminal 212, resulting in a low common mode gain. As a result, CMRR of the balun 100 is improved. In an example embodiment, the capacitance between magnetically-coupled windings is increased or decreased by increasing or decreasing the insulation between the windings or by increasing or decreasing the distance between the windings.

Figure 3:
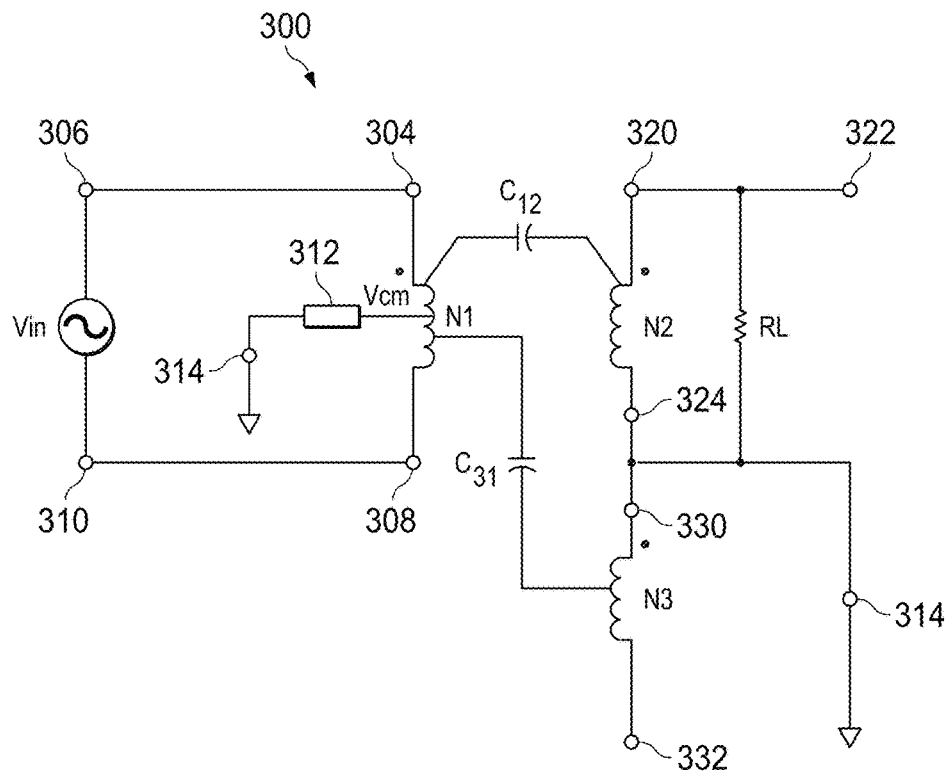
FIG. 3 is a circuit diagram of a differential to single-ended balun of an example embodiment.

FIG. 3 is a differential to single-ended balun 300 (also referred to as a D2S balun transformer) of an example embodiment. The balun 300 includes a first winding N1 (e.g., primary) which has a first terminal 304 coupled to a first differential input 306. The first winding N1 has a second terminal 308 coupled to a second differential input 310. An AC voltage source Vin can be coupled between the first and second differential inputs 306 and 310.

The first winding N1 has a tap 312 (e.g., center tap) which, in some example embodiments, may be coupled to a reference potential terminal 314 (e.g., electrical ground). In other embodiments, the center tap 312 may be an AC coupling capacitive element (not shown in FIG. 1) coupled to the reference potential terminal 314.

The balun 300 includes a second winding N2 (e.g., secondary) which is magnetically coupled to the first winding N1 (e.g., N1 and N2 may form the primary windings and secondary windings, respectively, of a transformer or N1 and N2 may be configured so as to facilitate magnetic coupling without forming a transformer). The second winding N2 has a first terminal 320 coupled to a single-ended output 322. Second winding N2 has a second terminal 324 which is coupled to the reference potential terminal 314 (e.g., electrical ground). A resistive load represented by RL is coupled between the single-ended output 322 and the reference potential terminal 314. In some example embodiments, the load RL may include a battery, circuitry, electronics or an electromechanical device.

The first and second windings N1 and N2 may be in close proximity to one another such that the first and second windings N1 and N2 are magnetically coupled. Due to close proximity, a capacitance represented by $C_{12}$ (which includes parasitic capacitors as well as intentionally added capacitors) may be present between the first and second windings N1 and N2. Because the voltage at primary winding N1 is not perfectly differential, a common mode component Vcm is present at the input terminals 306 and 310. The common mode component Vcm at the input terminals 306 and 308 is coupled to the output terminals 322 and 314, thus degrading the CMRR of the balun 300. Thus, it is desirable to reject the common mode component at the input terminals 306 and 310.

In an example embodiment, a third winding N3 (tertiary winding) is added to the balun 300 to reduce the effect of common mode current flowing through the capacitance $C_{12}$. The third winding N3 has a first terminal 330 which is coupled to the reference potential terminal 314. The third winding N3 has a second terminal 332 which is floating. In some example embodiments, winding N3 is implemented as a continuation of winding N2 with terminal 330 being a tap off of the winding. In some example embodiments, winding N3 is magnetically coupled to winding N1.

The third winding N3 may be in close proximity to the first winding N1 such that a capacitance represented by $C_{31}$ may be present between the third and first windings N3 and N1, respectively. In an example embodiment, the capacitance $C_{31}$ may include capacitors added intentionally as well as parasitic capacitors.

Figure 4:
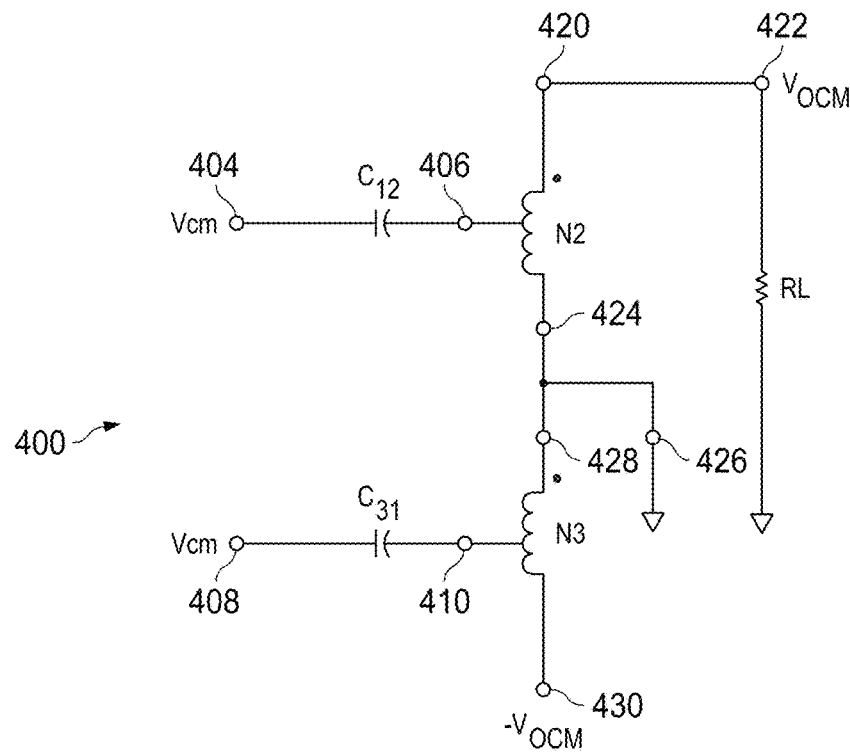
FIG. 4 is a common mode equivalent circuit of the balun of FIG. 3.

FIG. 4 is a common mode equivalent circuit 400 of the balun 300. The equivalent circuit 400 has the capacitor $C_{12}$ which has a first terminal 404 coupled to a common mode voltage Vcm (common mode component present across N1). The capacitor $C_{12}$ has a second terminal 406 coupled to the second winding N2.

The equivalent circuit 400 has the parasitic capacitor $C_{31}$ which has a first terminal 408 coupled to Vcm. The capacitor $C_{31}$ has a second terminal 410 coupled to the third winding N3.

The second winding N2 has a first terminal 420 which is coupled to a single-ended output 422. The second winding N2 has a second terminal 424 coupled to a reference potential terminal 426, which may be coupled to a common potential (e.g. ground). A resistive load represented by RL is coupled between the single-ended output 422 and a common potential (e.g., ground). The third winding N3 has a first terminal 428 coupled to the reference potential terminal 426. The third winding N3 has a second terminal 430 which is floating. A common mode current is injected into the secondary winding from the primary winding through the capacitor $C_{12}$. The common mode current produces a common mode voltage Vocm at the output 422.

Because the second terminal 424 of N2 and the first terminal 428 of N3 are both coupled to the reference potential 426 (e.g., electrical ground) and the second terminal 430 of N3 is floating, the voltage present at the second terminal 430 of N3 is approximately equal to the voltage present at the first terminal 420 of N1 but of an opposite polarity (e.g. −Vocm). By selecting $C_{31}$ and $C_{12}$ to have equal capacitances, the injected common mode current through $C_{12}$ is diverted away from RL making the common mode output voltage Vocm of the equivalent circuit 400 to zero. Thus, by adding the third winding N3, the effect of the common mode current flowing through the capacitor $C_{12}$ to the secondary winding N2 is reduced.

Figure 5A:
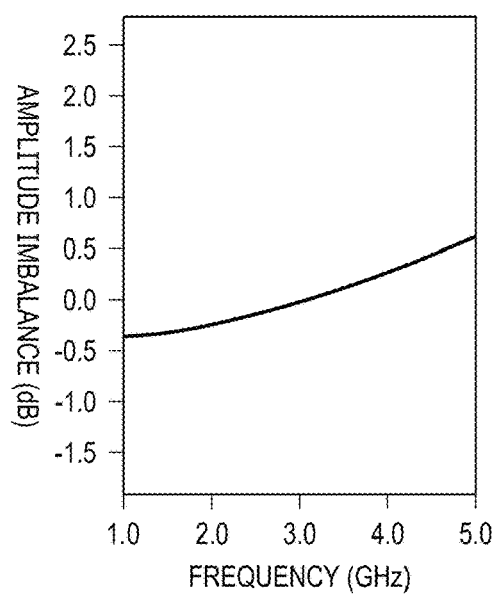
FIGS. 5A-5C are simulated waveforms of a balun of an example embodiment.

FIG. 5A is a simulated waveform of amplitude imbalance of a balun of an example embodiment. In this example, the balun is designed for a 2.5 GHz low noise amplifier (LNA). The x-axis represents frequency (GHz) and the y-axis represents amplitude imbalance (dB). At 1.0 GHz, the amplitude imbalance between two differential outputs is approximately −0.4 dB, and at 2.5 GHz, the amplitude imbalance between two differential outputs is approximately −0.15 dB. Thus, the balun exhibits a very low amplitude imbalance (i.e., less than 0.5 dB).

Figure 5B:
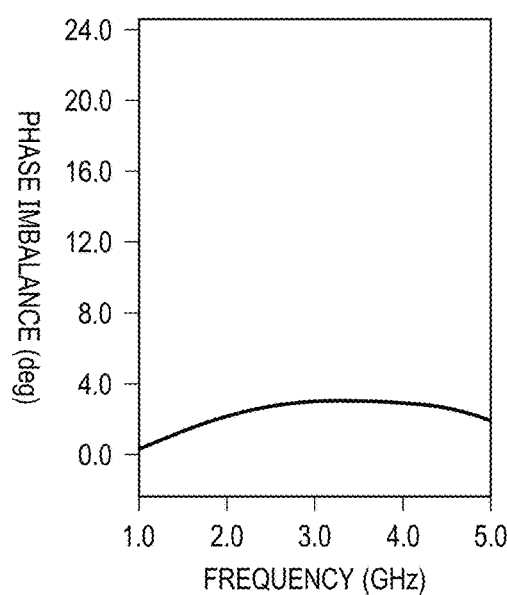

FIG. 5B is a simulated waveform illustrating phase imbalance of the balun. The x-axis represents frequency (GHz) and the y-axis represents phase (degrees). At 1 GHz, the phase imbalance between two differential outputs is 2.66 degrees and at 2.5 GHz, the phase imbalance between two differential outputs is 2.98 degrees. Thus, the balun exhibits a very low phase imbalance (i.e., less than 5 degrees).

Figure 5C:
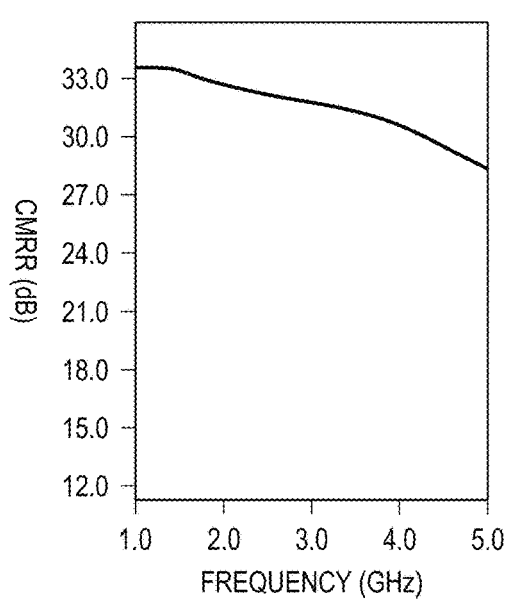

FIG. 5C is a simulated waveform of CMRR of the balun. The x-axis represents frequency (GHz) and the y-axis represents CMRR (dB). At 1 GHz, the CMRR is 33.2 dB and at 2.5 GHz, the CMRR is 32.12 dB. Thus, CMRR greater than 30 dB is obtained over a wide range of frequencies.

Windings N1, N2 and/or N3 may be implemented over a single semiconductor substrate in one or more example embodiments. For example, windings N1, N2 and/or N3 may be implemented as discussed in U.S. Pat. Nos. 9,276,056B2 and 10,181,834B2 and United States Patent Application Publication 2020/0388570A1 (also assigned to Texas Instruments Incorporated), all of which are hereby incorporated by reference in their entirety.

Figure 6A:
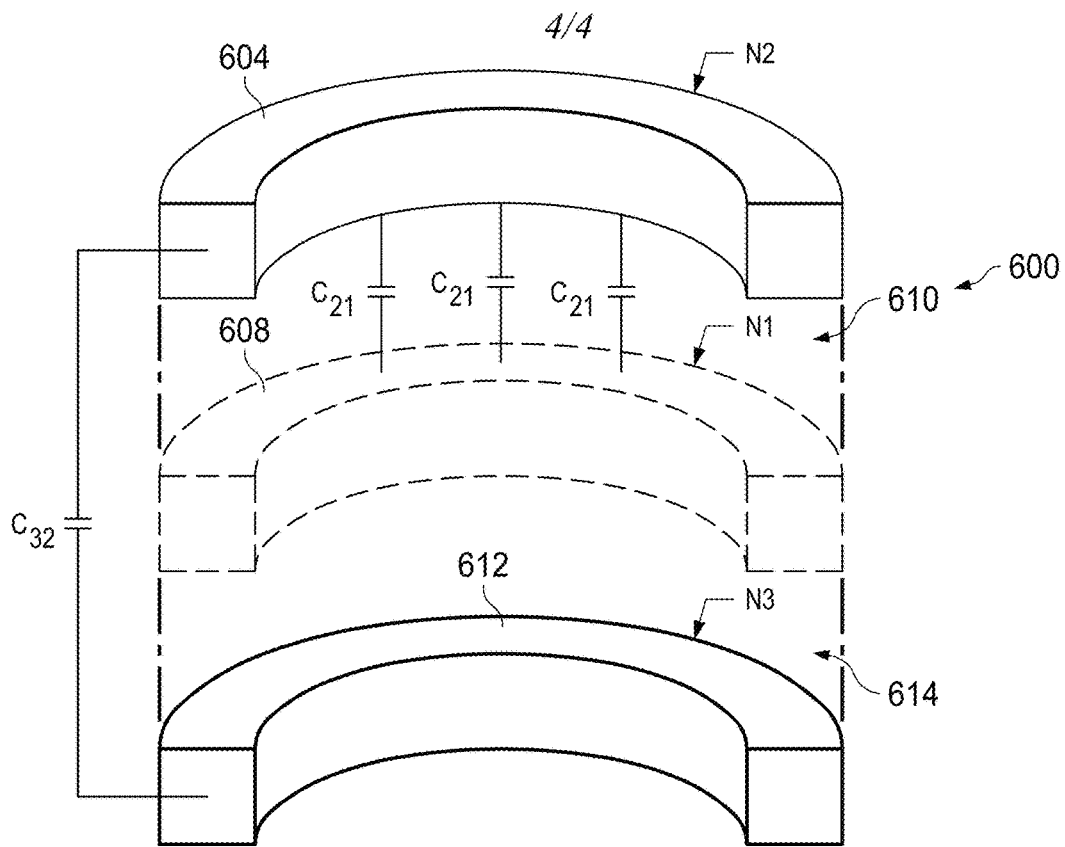
FIG. 6A is a cross-sectional view of a balun implemented in an integrated circuit.

FIG. 6A is a cross-sectional view of a balun 600 implemented in an integrated circuit (IC) in accordance with an example embodiment. The balun 600 includes a primary winding N1 608 (e.g. an implementation of N1 in FIG. 1 and/or FIG. 3), secondary winding N2 604 (e.g. an implementation of N2 in FIG. 1, FIG. 3 and/or FIG. 4), and tertiary winding N3 612 (e.g. an implementation of N3 in FIG. 1, FIG. 3 and/or FIG. 4). If N1, N2 and N3 are implemented over a semiconductor substrate (not shown), N1, N2 and N3 may be fabricated from any type of conductor used in semiconductor processing (such as copper, aluminum, tungsten, titanium, gold, any nitride form of the above or alloy of the above and/or any multi-layer structure formed from the above) and each are separated vertically from the other structure by an insulating layer that may be comprised of an oxide, nitride, oxynitride, doped oxide or any multi-layer structure formed from the above. In other example embodiments, windings N1, N2, and/or N3 may be fabricated in/on a printed circuit board. The semiconductor substrate may be comprised of silicon, silicon carbide and/or gallium arsenide. The substrates serve as foundations for the construction of the windings and other components of the balun 600.

The secondary winding N2 is made above the primary winding N1 and is separated from the primary winding N1 by a dielectric layer 610. The balun 600 includes a third winding N3 (tertiary winding) made below the primary winding N1 and is separated from N1 by a dielectric layer 614.

The balun 600 includes one or more capacitors $C_{21}$ between N1 and N2 and includes at least one capacitor $C_{32}$ (not shown) between N3 and N2. The capacitors $C_{21}$ and $C_{32}$ may include parasitic capacitors as well as capacitors added intentionally based on design requirements. Thus, the capacitors $C_{21}$ and $C_{32}$ may include a parasitic component and an intentionally-added component.

Figure 6B:
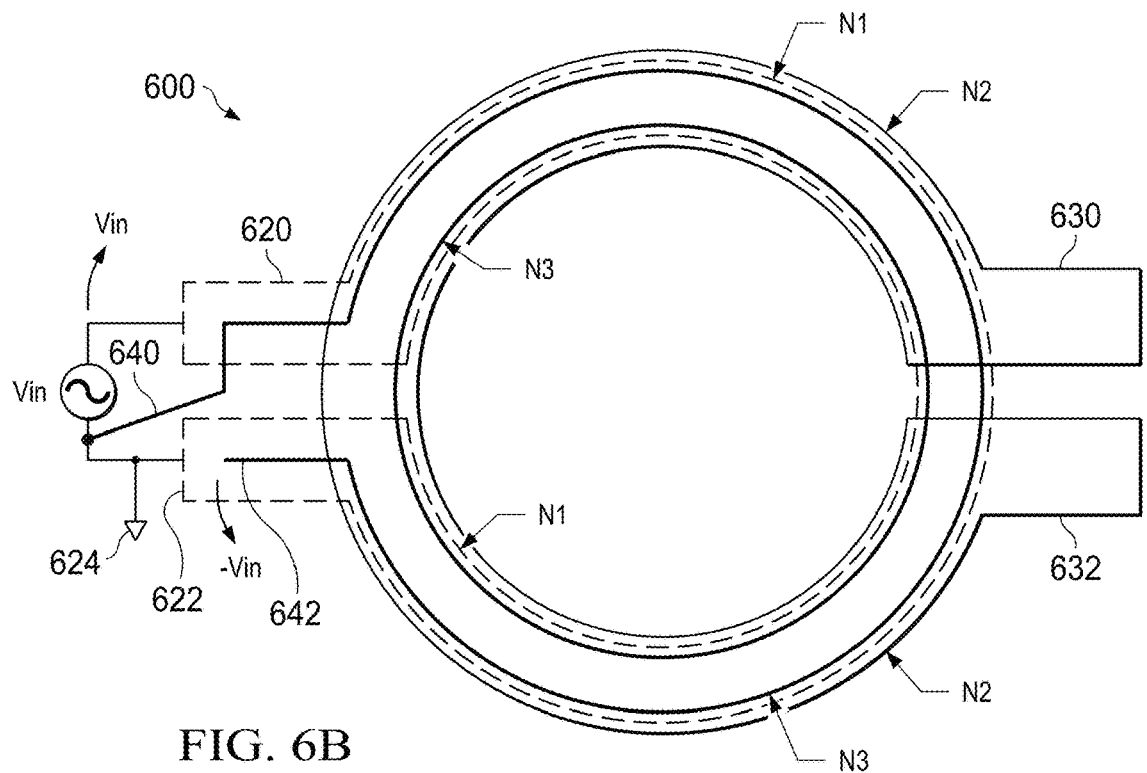
FIG. 6B is a top view of the balun of FIG. 6A.

FIG. 6B is a top view of the balun 600. The secondary winding N2 is shown in a solid light line, the primary winding N1 is shown in a dashed line, and the third winding N3 (tertiary winding) is shown in a solid dark line. The secondary winding N2 is made above the primary winding N1, and the third winding N3 is made below the primary winding N1. The balun 600 is configured as a single-ended-to-differential (S2D) balun. The primary winding N1 has first and second single-ended inputs 620 and 622. The second single-ended input 622 is coupled to a reference potential 624 (e.g., ground). A voltage source Vin is coupled between the first and second single-ended inputs 620 and 622. The secondary winding N2 has first and second differential outputs 630 and 632. The third winding N3 has a first terminal 640 coupled to the reference potential 624, and has a second terminal 642 which is floating. A voltage which is equal to Vin but of opposite polarity (−Vin) is present at the third winding N3's second terminal 642 which is floating.

Variations to the balun 600 within the scope of the disclosure are possible. For example, the primary winding N1 can be made above the secondary winding N2, and the third winding can be made below the secondary winding N2.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain transistors are described herein, other equivalent devices may be used in place of or in connection with these transistors. For example, in some embodiments, bipolar transistors, diodes, metal oxide semiconductor field effect transistors may be used in place of or in connection with the devices described herein. Furthermore, n-type devices may be replaced with p-type devices and vice versa. While, in some example embodiments, certain elements may be included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. A balun comprising:
   a first winding having a first terminal coupled to a first differential input, a second terminal coupled to a second differential input, and a tap coupled to a reference potential terminal;
   a second winding magnetically coupled to the first winding and having a first terminal coupled to a single-ended output and a second terminal coupled to the reference potential terminal;
   a third winding magnetically coupled to the first winding and having a first terminal coupled to the reference potential terminal and a floating second terminal;
   a first capacitor having a first terminal coupled to the first winding and a second terminal coupled to the second winding; and
   a second capacitor having a first terminal coupled to the third winding and a second terminal coupled to the first winding.

2. The balun of claim 1, wherein the tap is coupled to the center of the first winding.

3. The balun of claim 1, wherein the first capacitor and the second capacitor have equal capacitances.

4. The balun of claim 1, further comprising an input voltage source coupled between the first and second differential inputs.

5. The balun of claim 1, wherein the output provides a single-ended voltage.

6. A balun comprising:
a first winding having a first terminal coupled to a first differential input, a second terminal coupled to a second differential input, and tap coupled to a reference potential terminal;
a second winding magnetically coupled to the first winding and having a first terminal coupled to a single-ended output and a second terminal coupled to the reference potential terminal;
a first capacitor having a first terminal coupled to the first winding and a second terminal coupled to the second winding;
a third winding magnetically coupled to the first winding and having a first terminal coupled to the reference potential terminal and a floating second terminal; and
a second capacitor having a capacitance approximately equal to the capacitance of the first capacitor and having a first terminal coupled to the third winding and a second terminal coupled to the first winding.

7. The balun of claim 6, further comprising an input voltage source coupled between the first and second differential inputs.

8. The balun of claim 6, wherein the output provides a single-ended voltage.

9. An integrated circuit comprising:
a first winding made on a first substrate, the first winding having a first terminal coupled to a first differential input, a second terminal coupled to a second differential input, and a tap coupled to a reference potential terminal;
a second winding made on a second substrate, the second winding separated from the first winding by a first dielectric layer, the second winding having a first terminal coupled to a single-ended output and a second terminal coupled to the reference potential terminal; and
a third winding made on a third substrate, the third winding separated from the first winding by a second dielectric layer, the third winding having a first terminal coupled to the reference potential terminal and a floating second terminal.

10. The integrated circuit of claim 9 further comprising:
a first capacitor having a first terminal coupled to the first winding and a second terminal coupled to the second winding; and
a second capacitor having a first terminal coupled to the third winding and a second terminal coupled to the first winding.

11. The integrated circuit of claim 10, wherein the first capacitor and the second capacitor have equal capacitances.

12. The integrated circuit of claim 9, further comprising an input voltage source coupled between the first and second differential inputs.

13. The integrated circuit of claim 9, wherein the output provides a single-ended voltage.

\* \* \* \* \*